(12) United States Patent
Ciminello et al.

(10) Patent No.: US 7,325,685 B2
(45) Date of Patent: Feb. 5, 2008

(54) SECONDARY LATCHKEY MECHANISM AND METHOD FOR RETICLE SMIF PODS

(75) Inventors: Nicholas Frank Ciminello, White Plains, NY (US); David L. Schmoke, Verbank, NY (US); Edward Sherwood, Wingdale, NY (US)

(73) Assignee: International Business Machines Corporation, Armonk, NY (US)

( * ) Notice: Subject to any disclaimer, the term of this patent is extended or adjusted under 35 U.S.C. 154(b) by 571 days.

(21) Appl. No.: 10/721,560

(22) Filed: Nov. 25, 2003

(65) Prior Publication Data

US 2005/0109664 A1 May 26, 2005

(51) Int. Cl.
B65D 85/30 (2006.01)

(52) U.S. Cl. ...................... 206/454; 206/710

(58) Field of Classification Search ........... 206/710, 206/711, 303, 701, 449, 454, 455, 1.5, 832; 211/41.14, 41.17, 41.18; 414/217.1; 292/DIG. 65, 292/DIG. 11, 60, 163, 219; 70/63, 169, 173; 220/323, 324, 326, 8, 379, 348, 351, 676, 220/786, 787, 790

See application file for complete search history.

(56) References Cited

U.S. PATENT DOCUMENTS

| | | | | |
|---|---|---|---|---|
| 803,966 A | * | 11/1905 | Barnes | ............ 229/101 |
| 1,015,455 A | * | 1/1912 | Neesham | ............ 220/8 |
| 5,562,212 A | * | 10/1996 | Rosler | ............ 220/8 |
| 5,715,962 A | * | 2/1998 | McDonnell | ............ 220/8 |
| 5,829,591 A | * | 11/1998 | Lyons | ............ 220/8 |
| 6,502,869 B1 | | 1/2003 | Rosenquist et al. | |
| 6,536,813 B2 | | 3/2003 | Smith et al. | |
| 2002/0021009 A1 | | 2/2002 | Smith et al. | |
| 2002/0106266 A1 | | 8/2002 | Bonora et al. | |
| 2002/0149209 A1 | | 10/2002 | Bonora | |
| 2003/0012625 A1 | | 1/2003 | Rosenquist | |
| 2004/0118850 A1 | * | 6/2004 | Kim | ............ 220/8 |

* cited by examiner

*Primary Examiner*—J. Gregory Pickett
(74) *Attorney, Agent, or Firm*—Pastel Law Firm; Christopher R. Pastel

(57) ABSTRACT

A reticle SMIF pod includes a dome having a plurality of latchkeys and a cassette having a plurality of primary engagement locations thereon into which the latchkeys are intended to engage when sealing the cassette to the dome. A plurality of secondary engagement locations are positioned in the cassette above the plurality of primary engagement locations to prevent the cassette from falling should the plurality of latchkeys fail to engage in the primary engagement locations.

9 Claims, 7 Drawing Sheets

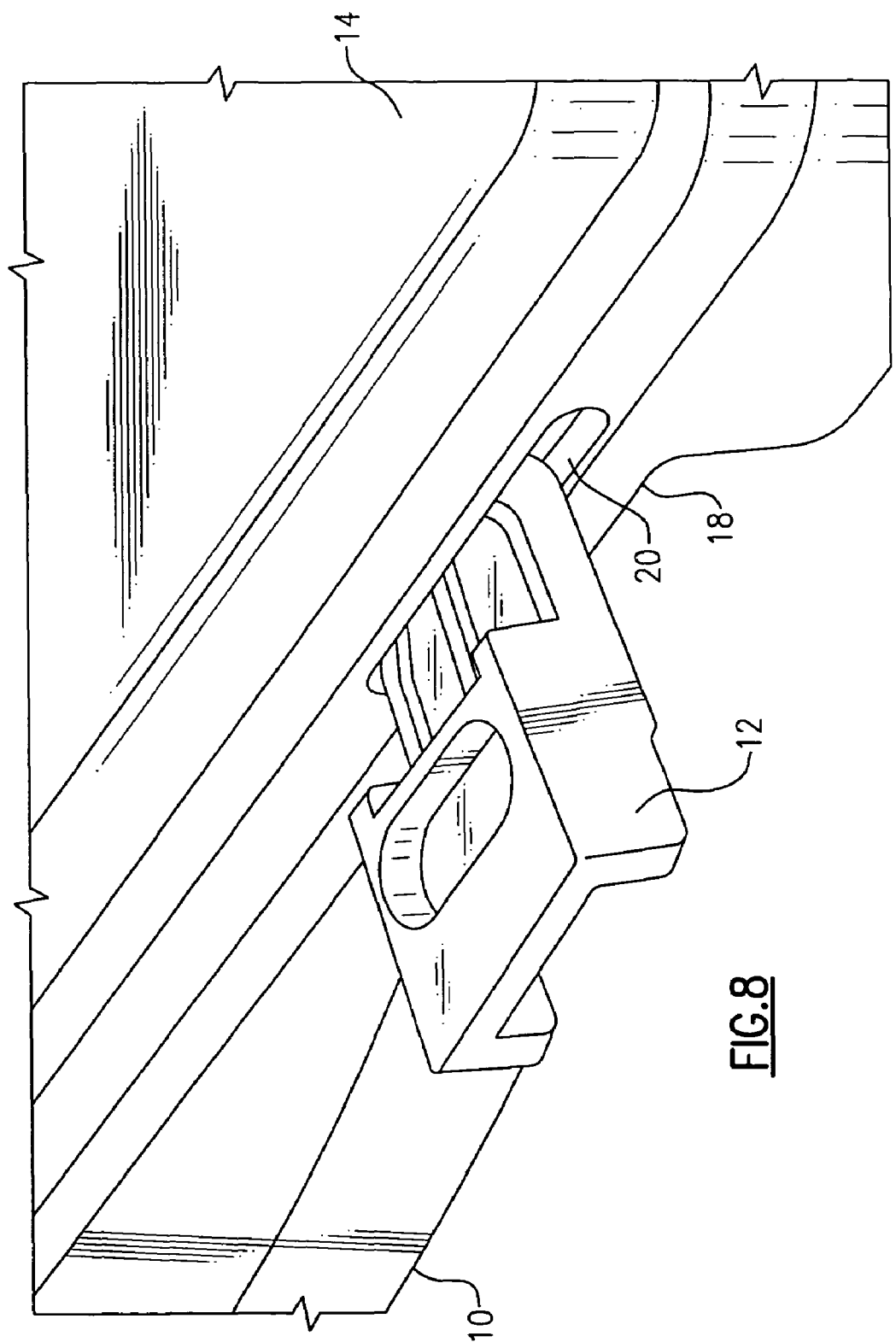

SECONDARY LATCHKEY MECHANISM AND METHOD FOR RETICLE SMIF PODS

FIELD OF THE INVENTION

This invention relates generally to the field of reticle SMIF pods, and more particularly to a secondary latchkey mechanism for a reticle SMIF pod.

BACKGROUND OF THE INVENTION

Standard Mechanical InterFace (SMIF) technology is widely used for reticle and wafer management in semiconductor fabrication facilities because of its ability to isolate reticles and wafers from harmful contaminants and protect them from mishandling throughout the manufacturing process. SMIF pods are designed for automated handling, transport, and storage of reticles both within the mask shop and between the mask shop and the semiconductor fabrication facility. Reticles are glass plates that contain a pattern of transparent and opaque areas, while wafers begin as silicon substrates that are ultimately processed into semiconductor chips. The reticles are used in the chip manufacturing process. Contamination control is an important part of the chip manufacturing process, both for reticles and patterned wafers.

A reticle SMIF pod designed to Semiconductor Equipment and Materials International (SEMI) standard SEMI E111-0302 includes three main components: the dome (top or cover), the cassette (bottom) which holds the reticle, and the latchkeys. The cassette attaches to the bottom of the dome to create a seal, and is held in place by four spring-loaded latchkeys. If the latchkeys fail to engage the cassette properly, there is a risk that the cassette will separate from the dome, thus allowing the cassette and reticle to fall to the ground resulting in damage and/or contamination of the reticle.

SUMMARY OF THE INVENTION

Briefly stated, a reticle SMIF pod includes a dome having a plurality of latchkeys and a cassette having a plurality of primary engagement locations thereon into which the latchkeys are intended to engage when sealing the cassette to the dome. A plurality of secondary engagement locations are positioned in the cassette above the plurality of primary engagement locations to prevent the cassette from falling should the plurality of latchkeys fail to engage in the primary engagement locations.

According to an embodiment of the invention, a reticle SMIF pod includes a dome having a plurality of latchkeys; a cassette having a plurality of primary engagement locations thereon wherein the latchkeys are intended to engage in the primary engagement locations to seal the cassette to the dome; and a plurality of secondary engagement locations positioned in the cassette above the plurality of primary engagement locations to prevent the cassette from falling should the plurality of latchkeys fail to engage in the primary engagement locations.

According to an embodiment of the invention, a reticle SMIF pod includes a dome having a plurality of dome engagement means for engaging the dome with a cassette; the cassette having a plurality of primary engagement means thereon wherein the dome engagement means are intended to engage with the primary engagement means to seal the cassette to the dome; and a plurality of secondary engagement means positioned in the cassette above the plurality of primary engagement means to prevent the cassette from falling should the plurality of dome engagement means fail to engage with the primary engagement means.

According to an embodiment of the invention, in a reticle SMIF pod which includes a dome with a plurality of latchkeys for engaging the dome with a cassette, wherein the cassette includes a plurality of primary latchkey receivers which are intended to engage with the plurality of latchkeys, a method for creating a backup fastening between the dome and the cassette should the plurality of latchkeys not properly engage with the primary latchkey receivers includes the step of providing a plurality of secondary latchkey receivers positioned in the cassette above the plurality of primary latchkey receivers to prevent the cassette from completely disengaging from the dome should the plurality of latchkeys fail to engage with the primary latchkey receivers.

BRIEF DESCRIPTION OF THE DRAWINGS

FIG. 8 shows a front perspective view of part of a reticle SMIF pod dome latched to a reticle SMIF pod cassette according to an embodiment of the invention.

DETAILED DESCRIPTION OF THE PREFERRED EMBODIMENT

Figure 1:
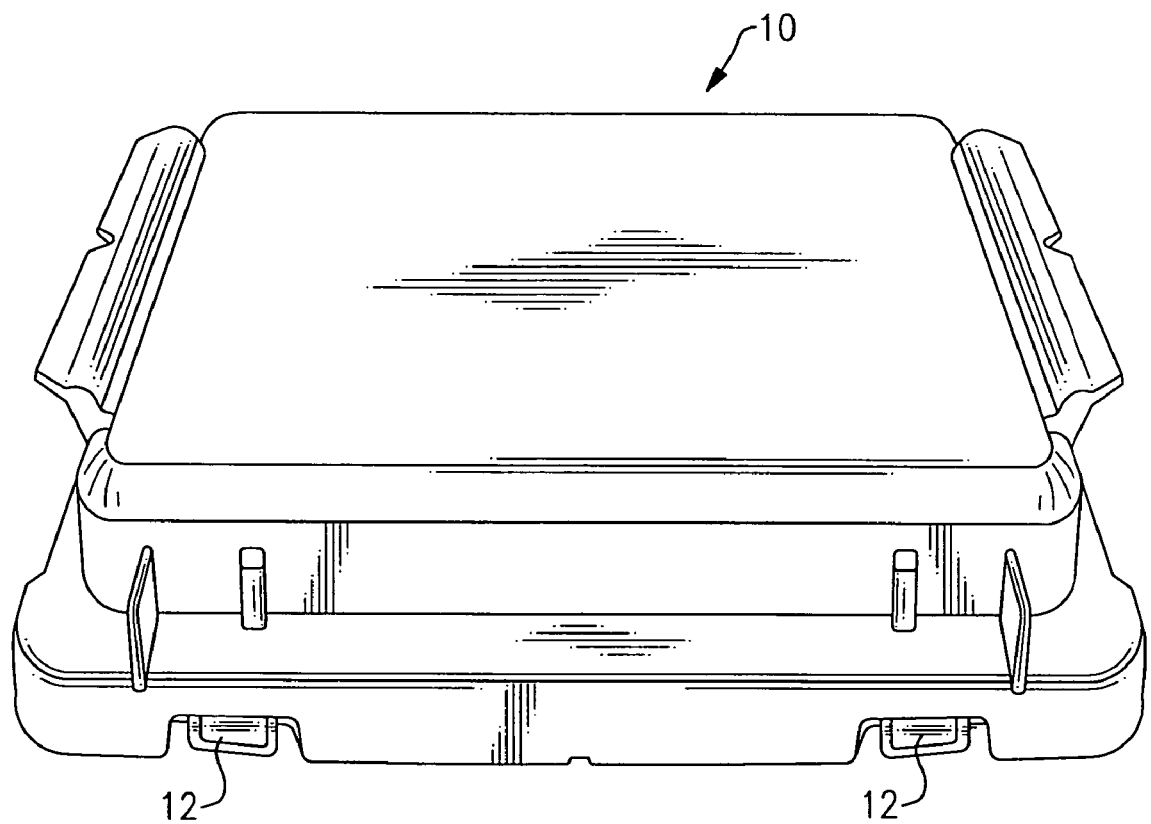
FIG. 1 shows a top perspective view of a reticle SMIF pod dome according to the prior art.
Figure 2:
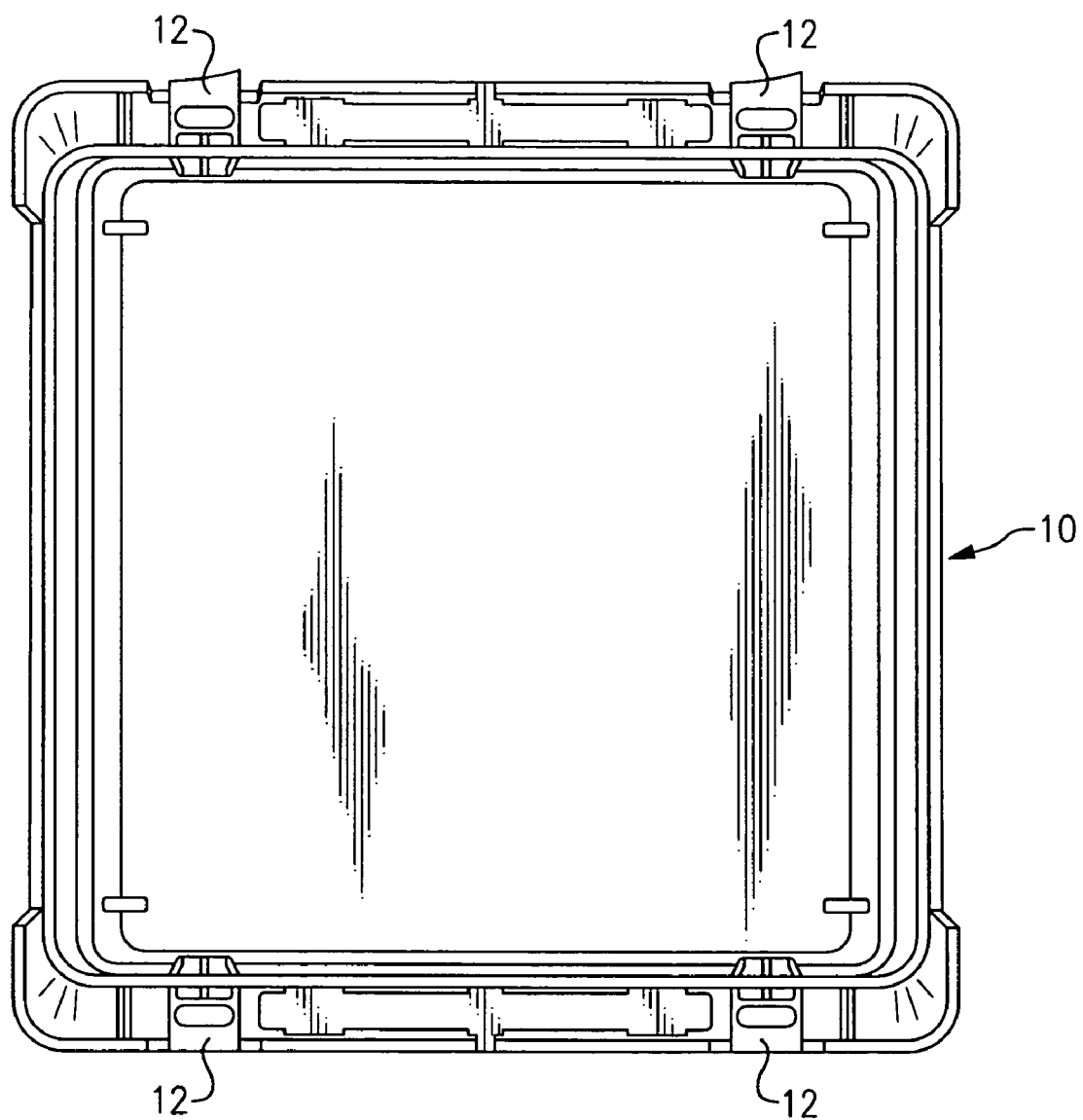
FIG. 2 shows a bottom view of the reticle SMIF pod dome of FIG. 1.

Referring to FIGS. 1-2, a dome 10 for a reticle SMIF (Standard Mechanical InterFace) pod is shown which includes a plurality of spring loaded latchkeys 12. Dome 10 includes four latchkeys in accord with standard SEMI E111-0302. Other features of dome 10 evident from FIG. 1 relate to automated handling of the SMIF pod and are not relevant to the present invention.

Figure 3:
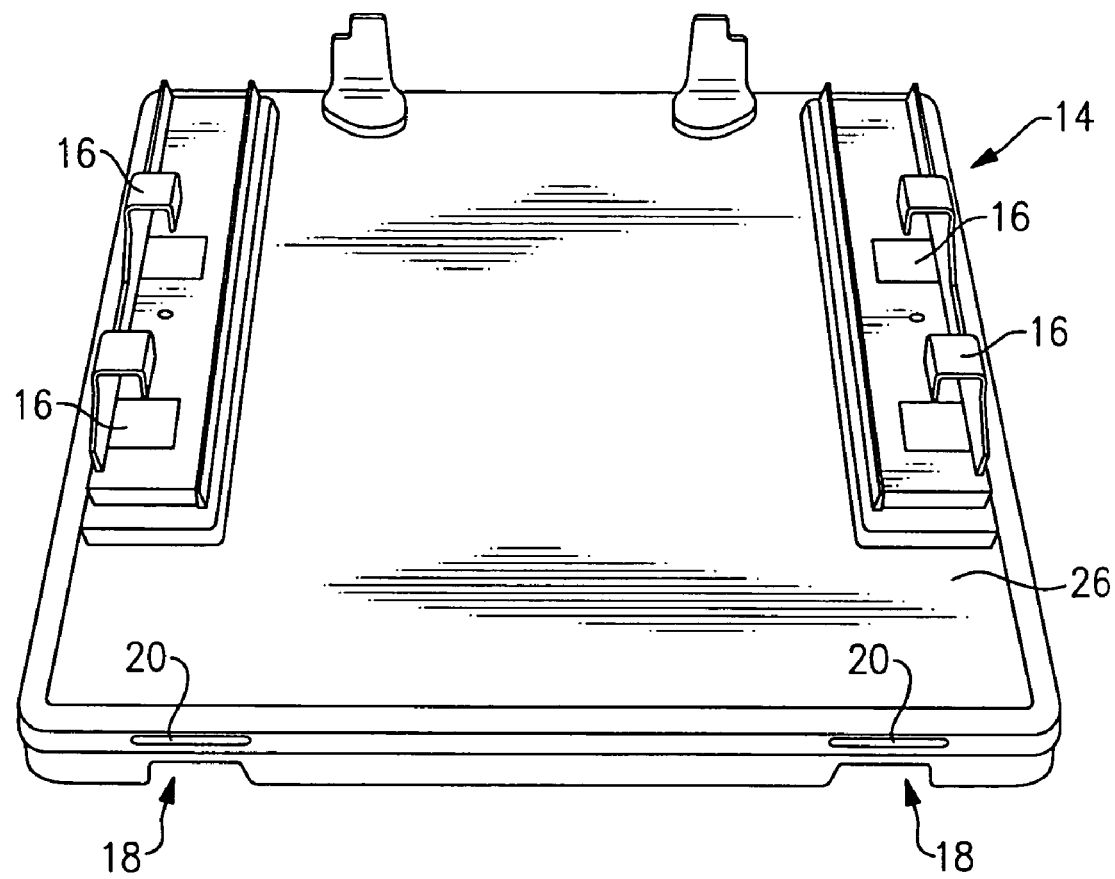
FIG. 3 shows a top perspective view of a reticle SMIF pod cassette according to an embodiment of the invention, without the reticle mounted in the cassette.

Referring to FIG. 3, a top view of a reticle SMIF pod cassette 14 shows a plurality of reticle supports 16 on a reticle base 26. A plurality of primary latchkey receivers 18 interoperate with latchkeys 12 when dome 10 (FIG. 1) is connected to cassette 14. A plurality of secondary latchkey receivers 20 are disposed above primary latchkey receivers 18.

Figure 4:
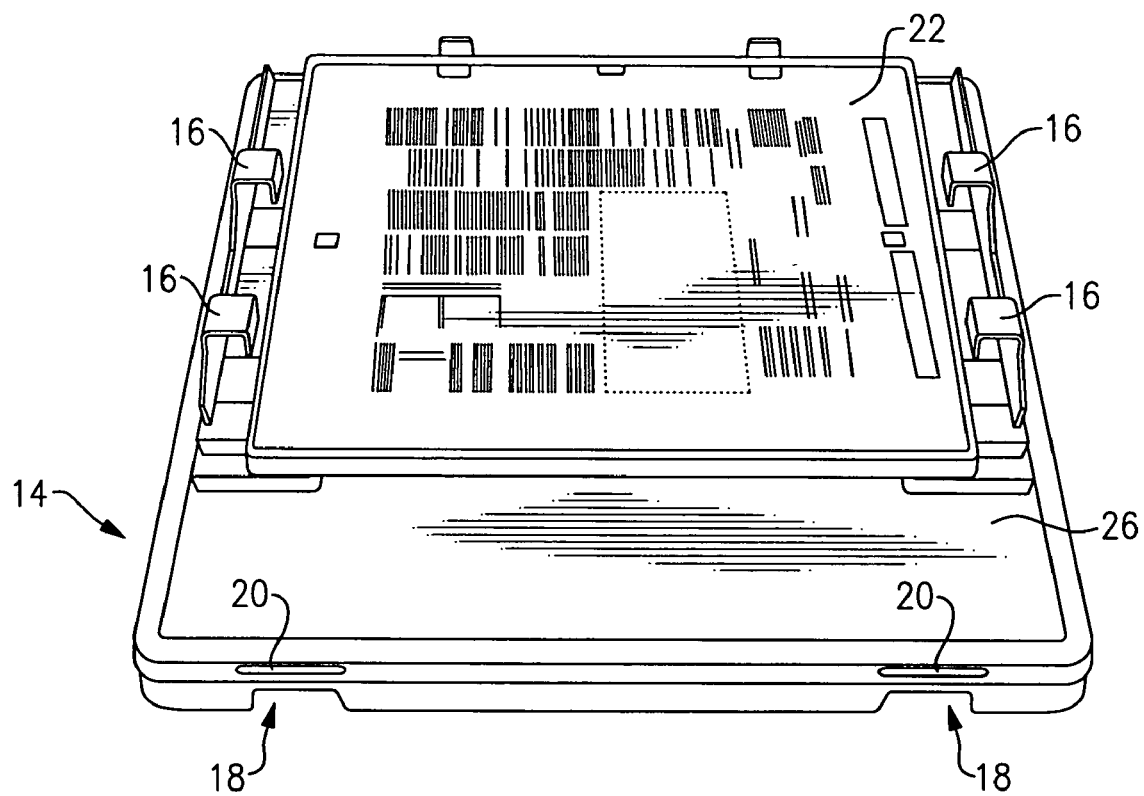
FIG. 4 shows top perspective view of a reticle SMIF pod cassette according to an embodiment of the invention, with the reticle mounted in the cassette.

Referring to FIG. 4, a reticle 22 is shown supported in cassette 14. Dome 10 (FIG. 1) fits over cassette 14 to house reticle 22 in a mini-clean room environment for transport.

Figure 5:
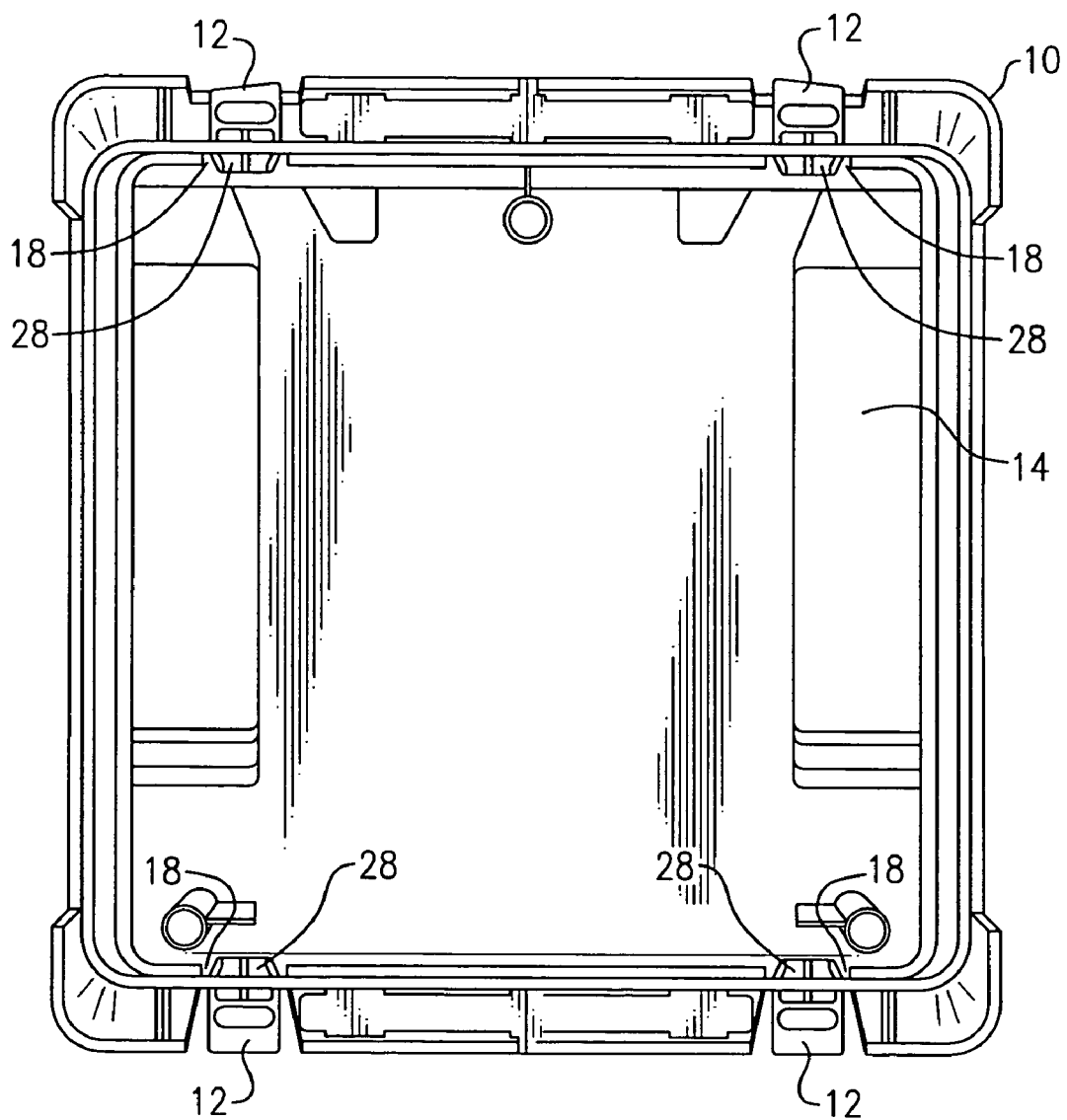
FIG. 5 shows a bottom view of a reticle SMIF pod cassette attached to a reticle SMIF pod dome.

Referring to FIG. 5, a bottom view of cassette 14 connected to dome 10 is shown. Ends 28 of latchkeys 12 of dome 10 fit inside primary latchkey receivers 18 to secure cassette 14 to dome 10.

Figure 6:
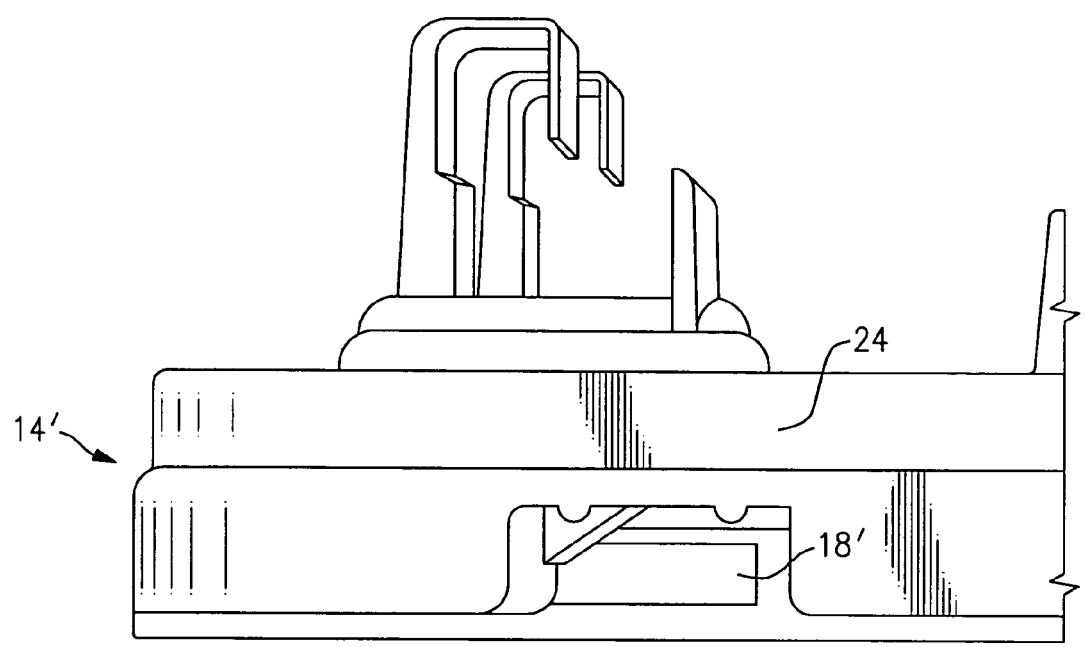
FIG. 6 shows a front elevation view of part of a reticle SMIF pod cassette according to the prior art.

Referring to FIG. 6, part of a cassette 14' according to the prior art is shown which includes a latchkey receiver 18'.

Note that unlike the present invention, a smooth surface 24 is above latchkey receiver 18'.

Figure 7:
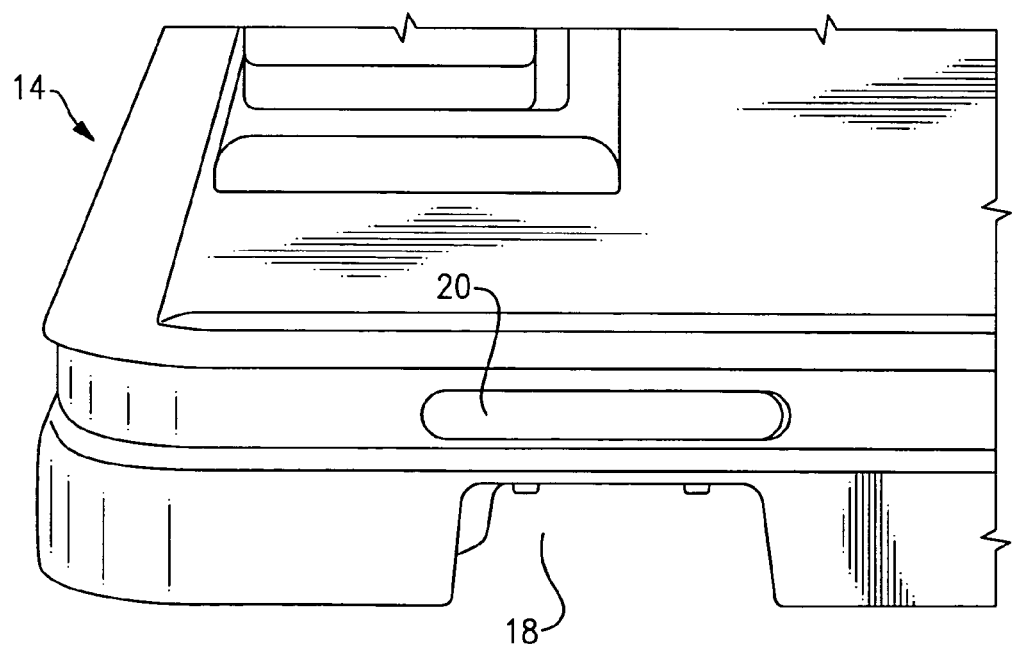
FIG. 7 shows a front perspective view of part of a reticle SMIF pod cassette according to an embodiment of the invention.

Referring to FIG. 7, part of cassette 14 is shown which includes one primary latchkey receiver 18 with one secondary latchkey receiver above it. Although four latchkeys 12 and four primary latchkey receivers 18 are part of the standard SEMI E111-0302, the secondary latchkey receivers 20 of the present invention do not have to match the number of primary latchkey receivers. Preferably, each primary latchkey receiver 18 has a secondary latchkey receiver 20 associated with it, but other variations are possible.

Secondary latchkey receivers 20 need only be shaped to fit in the space available on cassette 14 and to be effective for catching latchkeys 12 should latchkeys 12 fail to engage properly with primary latchkey receivers 18. Generally, therefore, it is preferable for the shape of secondary latchkey receivers 20 to have approximately the same shape as primary latchkey receivers 18.

Referring to FIG. 8, a portion of cassette 14 connected to dome 10 is shown. In the event that latchkey 12 doesn't properly engage with primary latchkey receiver 18, because latchkey 12 is spring-loaded, latchkey 12 presses against cassette 14. As cassette 14 begins to slip out of position with dome 10 due to the engagement failure between latchkey 12 and primary latchkey receiver 18, latchkey 12 engages with secondary latchkey receiver 20, thus preventing cassette 14 and reticle 22 (FIG. 4) from dropping out of dome 10 and becoming damaged.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A reticle SMIF pod, comprising:
   a dome having a plurality of spring-loaded latchkeys;
   a cassette having a plurality of primary engagement locations thereon wherein said latchkeys engage in said primary engagement locations to seal a base of said cassette to said dome; and
   a plurality of secondary engagement locations positioned in said cassette corresponding to and disposed between said plurality of primary engagement locations and said base of said cassette, such that when a single one of said plurality of latchkeys fails to engage in a corresponding one of said primary engagement locations, said single one of said plurality of latchkeys engages in a corresponding one of said secondary engagement locations to prevent said cassette from completely disengaging from said dome.

2. A reticle SMIF pod according to claim 1, wherein said plurality of secondary engagement locations corresponds in equal number to said plurality of primary engagement locations.

3. A reticle SMIF pod according to claim 1, wherein said plurality of secondary engagement locations are of a lesser number than said plurality of primary engagement locations.

4. A reticle SMIF pod, comprising:
   a dome;
   a cassette;
   said dome having a plurality of dome engagement means for engaging said dome with said cassette;
   said cassette having a plurality of primary engagement means thereon wherein said dome engagement means engage with said primary engagement means to seal a base of said cassette to said dome; and
   a plurality of secondary engagement means positioned in said cassette corresponding to and disposed between said plurality of primary engagement means and said base of said cassette, such that when a single one of said plurality of dome engagement means fails to engage in a corresponding one of said primary engagement means, said single one of said plurality of dome engagement means engages in a corresponding one of said secondary engagement means to prevent said cassette from completely disengaging from said dome.

5. A reticle SMIF pod according to claim 4, wherein said plurality of secondary engagement means corresponds in equal number to said plurality of primary engagement means.

6. A reticle SMIF pod according to claim 4, wherein said plurality of secondary engagement means are of a lesser number than said plurality of primary engagement means.

7. In a reticle SMIF pod which includes a dome with a plurality of spring-loaded latchkeys for engaging said dome with a cassette, wherein said cassette includes a plurality of primary latchkey receivers which are intended to engage with said plurality of latchkeys, a method for creating a backup fastening between said dome and said cassette should said plurality of latchkeys not properly engage with said primary latchkey receivers, comprising the step of providing a plurality of secondary latchkey receivers positioned in said cassette corresponding to and disposed between said plurality of primary latchkey receivers and a base of said cassette, such that when a single one of said plurality of latchkeys fails to engage in a corresponding one of said primary latchkey receivers, said single one of said plurality of latchkeys engages in a corresponding one of said secondary latchkey receivers to prevent said cassette from completely disengaging from said dome.

8. A method according to claim 7, wherein said plurality of secondary latchkey receivers corresponds in equal number to said plurality of primary latchkey receivers.

9. A method according to claim 7, wherein said plurality of secondary latchkey receivers are of a lesser number than said plurality of primary latchkey receivers.

* * * * *